United States Patent
Funahashi et al.

[11] Patent Number: 5,191,298
[45] Date of Patent: Mar. 2, 1993

[54] ISOLATION AMPLIFIER CIRCUIT
[75] Inventors: Hiroyuki Funahashi; Chung C. San, both of Kyoto, Japan
[73] Assignee: Rohm Co., Ltd., Kyoto, Japan
[21] Appl. No.: 795,432
[22] Filed: Nov. 21, 1991
[30] Foreign Application Priority Data
Nov. 24, 1990 [JP] Japan .................... 2-319999
[51] Int. Cl.[5] ............... H03F 1/30; H03F 3/68
[52] U.S. Cl. ..................... 330/149; 330/124 R; 381/121
[58] Field of Search ........... 330/149, 85, 124 R, 330/295, 311, 260; 381/120, 121, 28

[56] References Cited
U.S. PATENT DOCUMENTS

| | | | |
|---|---|---|---|
| 3,394,269 | 7/1968 | Miner | 307/229 |
| 3,947,695 | 3/1976 | Silvia | 307/85 |
| 4,365,207 | 12/1982 | Fukuchi | 330/260 |
| 4,378,467 | 3/1983 | Ferrantelli | 381/120 X |
| 4,801,889 | 1/1989 | Fujisawa | 381/121 X |

FOREIGN PATENT DOCUMENTS
2614741 11/1988 France .

Primary Examiner—Steven Mottola
Attorney, Agent, or Firm—Nikaido, Marmelstein, Murray & Oram

[57] ABSTRACT

A isolation amplifier circuit comprises: an operation amplifier provided with a first and second input terminals, an output terminal, and a feedback resistor for connecting the output terminal and second input terminal; a first emitter follower, for inputting a signal, connected to the first input terminal; a second emitter follower connected between the output terminal and the feedback resistor; a third emitter follower connected between the second input terminal and a first ground impedance; and a fourth emitter follower connected between the first input terminal and a second ground impedance. In the isolation circuit, dynamic resistances of the first, second, third, and fourth emitter followers are made identical with one another.

6 Claims, 5 Drawing Sheets

ISOLATION AMPLIFIER CIRCUIT

BACKGROUND OF THE INVENTION

1. Field of the Invention

The present invention relates to an isolation amplifier circuit, and particularly, to an isolation amplifier circuit for a noise cancel circuit of an audio apparatus such as a stereo sound system.

2. Description of the Prior Art

In a car audio apparatus such as a stereo sound system installed on a car, noise induced by an engine or other devices easily intrudes into an audio power amplifier since a car body is used as a ground portion of a circuit. As a result, sound quality is deteriorated. Thus, it is required to cancel the noise on the way to the audio power amplifier.

FIG. 1 shows a conventional car audio circuit having a noise cancel circuit. Numeral 1 is a tuner deck having amplifiers 4 and 5 respectively connected to input terminals 2 and 3 to which audio signals of left (L) and right (R) channels of a stereo are input. An output thereof is connected to input terminals 9 and 10 of a noise cancel circuit 8 through capacitors 6 and 7. The noise cancel circuit 8 is formed with an integrated circuit (IC). The input terminals 9 and 10 are connected to plus terminals of buffers 11 and 12. Output terminals of buffers 11 and 12 are connected to plus terminals of operation amplifiers 13 and 14 through resistors R3 and R3'. Minus input terminals of the operation amplifiers 13 and 14 are connected to output terminals through resistors R2 and R2'. They are connected also to a first common ground terminal 15 through resistors R1 and R1'. To the first common ground terminal 15, a capacitor 16 is connected. The other end of the capacitor 16 is connected, together with the tuner block 1, to a car body 18 at ground point 17. Plus input terminals of the operation amplifiers 13 and 14 are connected to a second common ground terminal 19 through resistors R4 and R4'. To the second common ground terminal 19, a capacitor 20 is connected. The output terminals of the operation amplifiers 13 and 14 are connected to output terminals 21 and 22. The output terminals 21 and 22 are connected to audio power amplifiers 25 and 26 through capacitors 23 and 24. To the power amplifiers 25 and 26, speakers 27 and 28 are connected as shown in the figure.

Next, operation of the noise cancel circuit 8 in the car audio circuit will be described. Noise from a noise source 29 is equivalent to noise which exists in the car body 1. The noise is divided into several elements: a) noise which intrudes from the ground point 17 into the plus input terminal of the operation amplifier 13 for the L channel by way of the tuner deck 1, the amplifier 4, the terminal 9, and the buffer 11; b) noise which intrudes from the ground point 17 into the plus input terminal of the operation amplifier 14 for the R channel by way of the tuner deck 1, the amplifier 5, the terminal 10, and the buffer 12; c) noise which intrudes from the ground point 17 into the minus input terminal of the operation amplifier 13 for the L channel by way of the capacitor 16, the first common terminal 15, and the resistor R1; and d) noise which intrudes from the ground point 17 into the minus input terminal of the operation amplifier 14 for the R channel by way of the capacitor 16, the first common terminal 15, and the resistor R1'.

Only cancellation of noise of the L channel will be described, since the principle of noise cancellation of the R channel is the same as that of noise cancellation of the L channel. As described above, noise intrudes into the plus and minus input terminals of the operation amplifier 13 for the L channel. If the noise intruding into the plus input terminal and the noise intruding into the minus input terminal are equal to each other in phase and size, the noises are canceled by a common-mode input rejection action of the operation amplifier 13 for the L channel, so that the noises are not included in an output of the operation amplifier 13 for the L channel.

For the above-described noise cancellation, it is required that the equation $R1 \times R4 = R3 \times R2$ (i.e. $R1/R2 = R3/R4$) is fulfilled with respect to the resistors, and that $e1 = e2$ where $e1$ and $e2$ are noise signal voltages of the plus and minus input terminals.

For the above-described conventional art, the capacity of the capacitor 16 connected to the first common ground terminal 15 has to be large. This is because if the capacity of the capacitor 16 is small, impedance is large so that $R1/R2 = R3/R4$ which is one of the conditions for noise cancellation cannot be fulfilled since the capacitor 16 is equivalently included by impedance of the resistor R1. For this reason, the capacity of the capacitor 16 has to be large (impedance has to be small).

Moreover, in a circuit, for example, where the capacitor 16 is not connected to the first common ground terminal 15, noise cancel is interfered with when impedance connected to the first common ground terminal 15 is large.

SUMMARY OF THE INVENTION

An object of the present invention is to provide an isolation amplifier circuit where a condition for noise cancel are fulfilled even if impedance connected to common ground terminals of an L and R channels is large.

According to one feature of the present invention, the isolation amplifier circuit is provided with: an operation amplifier having a first and second input terminals, an output terminal, and a feedback resistor for connecting the output terminal and second input terminal; a first emitter follower, for inputting a signal, connected to the first input terminal; a second emitter follower connected between the output terminal and the feedback resistor; a third emitter follower connected between the second input terminal and a first ground impedance; a fourth emitter follower connected between the first input terminal and a second ground impedance; and means for making dynamic resistance of each of the first, second, third, and fourth emitter followers identical with one another.

According to another feature of the present invention, the isolation amplifier circuit for a car audio apparatus is provided with: an operation amplifier, for an L channel of a car stereo sound system, provided with a first and second input terminals, a first output terminal, and a first feedback resistor for connecting the first output terminal and a second output terminal; a first emitter follower, for inputting an L-channel audio signal, connected to the first input terminal; a second emitter follower connected between the first output terminal and the first feedback resistor; a third emitter follower connected between the second input terminal and a first ground impedance; a fourth emitter follower connected between the first input terminal and a second ground impedance; an operation amplifier, for an R channel of a car stereo apparatus, provided with a third and fourth input terminals, a second output terminal, and a second feedback resistor for connecting the second output terminal and the fourth input terminal; a fifth emitter follower, for inputting an R-channel audio signal, connected to the third input terminal; a sixth emitter follower connected between the second output terminal and the second feedback resistor; means for connecting the fourth input terminal to the third emitter follower in order to connect the fourth input terminal to the first ground impedance; and means for connecting the third input terminal to the fourth emitter follower in order to connect the third input terminal to the second ground impedance.

According to the above-described arrangements, since the first and second ground impedances are equivalently converted into low impedance by the third and fourth emitter followers even if impedance thereof is high, impedance on the output side of the third and fourth emitter followers is not affected. Thus, a condition for canceling noise which intrudes into, for example, the first and second input terminals is never broken by the first and second ground impedances.

Moreover, since all of the dynamic resistances of the first to fourth emitter followers are identical, it becomes possible to substantially cancel the dynamic resistances. Consequently, distortion based on dynamic resistance is not caused in an output voltage.

BRIEF DESCRIPTION OF THE DRAWING

This and other objects and features of this invention will become clear from the following description, taken in conjunction with the preferred embodiments with reference to the accompanied drawings in which.

DETAILED DESCRIPTION OF THE PREFERRED EMBODIMENT

Embodiments of the present invention will hereinafter be described with reference to the drawings.

Figure 2:
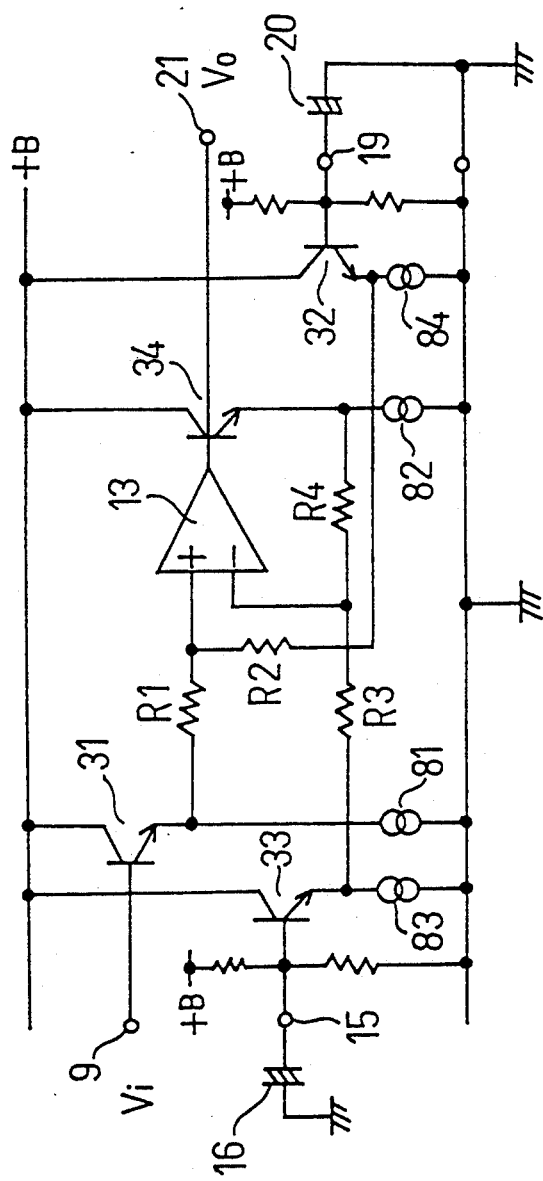
FIG. 2 is a circuit diagram of an isolation amplifier circuit in which the present invention is incorporated.

In FIG. 2, where an embodiment of the present invention is shown, an input signal is applied from an input terminal 9 to a plus input terminal (a first input terminal) of an operation amplifier 13 via an emitter follower 31 and a resistor R1. An output of the operation amplifier 13 is returned to a minus input terminal (a second input terminal) via an emitter follower 34 and a feedback resistor R4 connected to an output terminal as well as is directed to an output terminal 21. The minus input terminal is connected to a ground terminal 15 through a resistor R3 and an emitter follower 33. To the ground terminal 15, a grounding capacitor 16 is connected. The plus input terminal is connected to a ground terminal 19 through a resistor R2 and a fourth emitter follower 32. To the ground terminal 19, a capacitor 20 is connected.

According to the present embodiment, capacity values of the capacitors 16 and 20 are small. As a result, although impedance of the capacitors 16 and 20 is larger, sizes of the resistors R2 and R3 are hardly affected, since the impedance of each of the capacitors 16 and 20 is impedance-converted by the emitter followers 32 and 33 so that it becomes low on the output side (emitter side) of the emitter followers 32 and 33. This means that R1/R2=R3/R4, which is a condition for canceling noise intruding through the ground terminals 15 and 19, is not broken. According to the present embodiment, the resistors R1, R2, R3, and R4 are connected to the emitter followers 31, 32, 33, and 34, respectively. This is because an influence of dynamic resistances of the emitter followers cannot be removed if there are only less emitter followers. That is, a dynamic resistance re, of an emitter follower, which is defined by $re = 1/gm = kT/qI_E$ (where gm is a mutual conductance, k is a Boltzman's constant, T is an absolute temperature, q is an electric charge, and $I_E$ is an emitter current), is varied according to temperature, and other factors and can therefore cause distortion.

Thus, the emitter followers 31, 32, 33, and 34 are provided to all of the resistors R1, R2, R3, and R4 in order to remove an influence of the dynamic resistance re.

It is comparatively easy to design an integrated circuit so that constant current sources 81, 82, 83, and 84 on the emitter side are identical in order to make identical dynamic resistors re1, re2, re3, and re4 of the emitter followers 31, 32, 33, and 34. The dynamic resistances are set by constant current sources, etc. provided to the emitters.

In FIG. 2, $$V_o = \frac{re2 + R2}{re1 + R1 + re2 + R2} \cdot \frac{re3 + R3 + re4 + R4}{re3 + R3} V_i$$

where Vi is an input voltage and Vo is an output voltage. In the above equation, when re1=re2=re3=re4, the output voltage Vo is proportional to the input voltage Vi, so that an output signal of low distortion factor is obtained.

Figure 1:
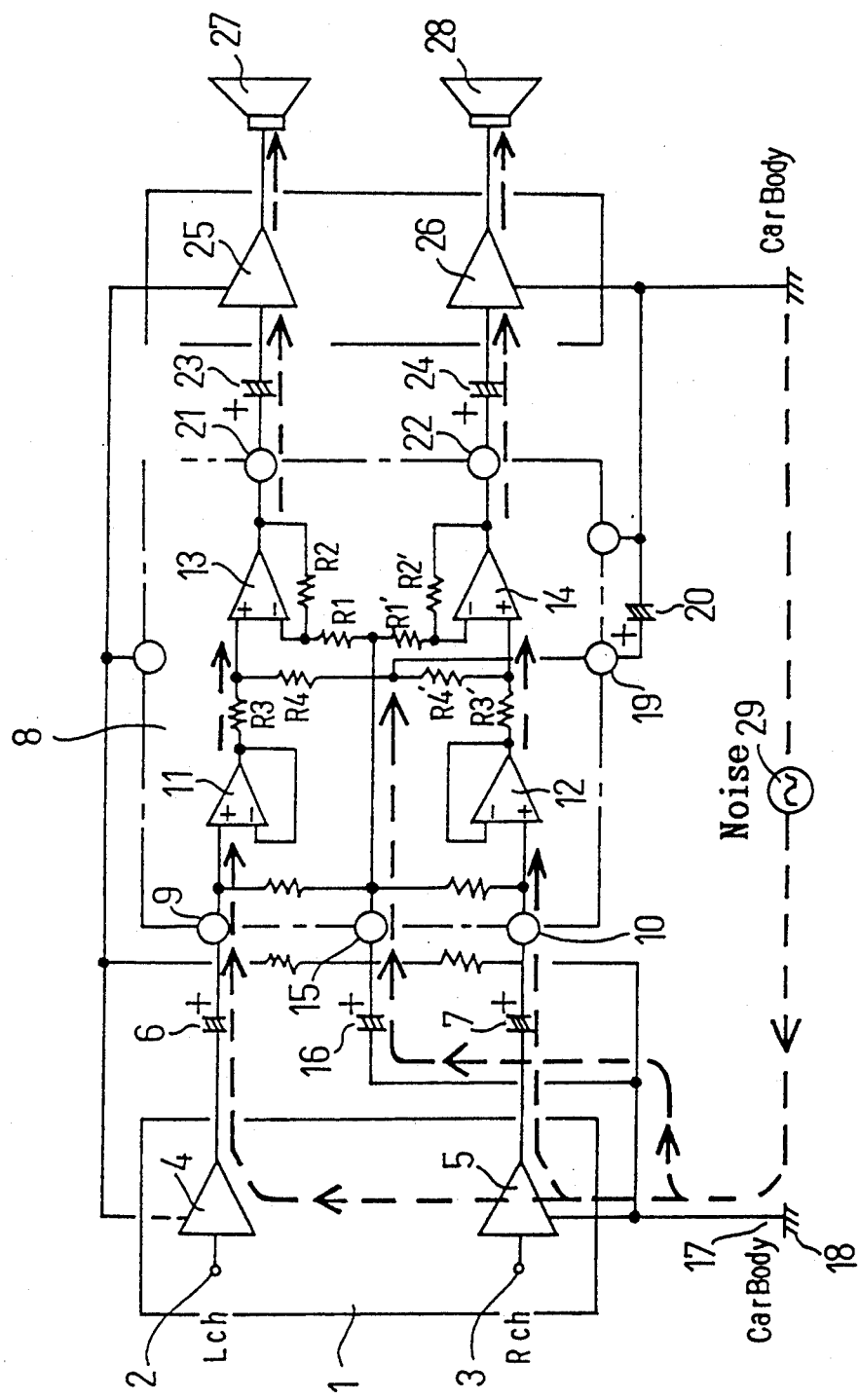
FIG. 1 is a circuit diagram of a conventional isolation amplifier circuit.

In the circuit of FIG. 2, an input signal from the input terminal 9 is inputted to the operation amplifier 13 through the emitter follower 31. The structure thereof is simpler compared to that of the conventional circuit (shown in FIG. 1) where the buffer 11 consists of an operation amplifier.

Figure 3:
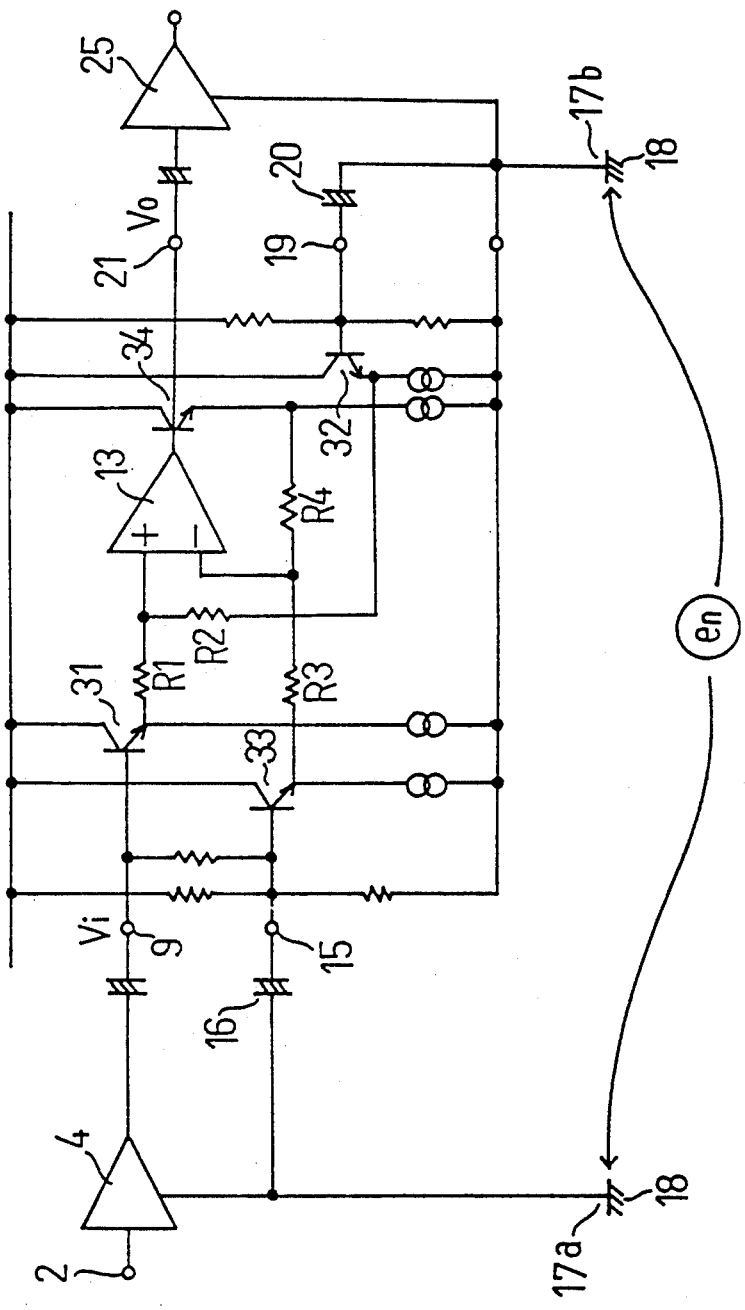
FIG. 3 is a circuit diagram of the isolation amplifier of FIG. 2 employed as a noise cancel circuit of a car audio apparatus.

Next, FIG. 3 shows the above-described isolation amplifier circuit of FIG. 2 employed as a noise cancel circuit of a car audio apparatus. Numerals 4 and 25 are a preamplifier and an audio power amplifier, respectively. They are connected, together with a capacitor, to a car body 18 at ground points 17a and 17b.

The output voltage Vo is defined by $$V_o = \frac{re2 + R2}{re1 + R1 + re2 + R2} \cdot \frac{re3 + R3 + re4 + R4}{re3 + R3} \cdot$$

$$(es + e1) - \frac{re4 + R4}{re3 + R3} \cdot e2 = \frac{re4 + R4}{re3 + R3}(e1 - e2) +$$

$$\frac{(re2 + R2)(re3 + R3) - (re1 + R1)(re4 + R4)}{(re3 + R3)(re1 + R1 + re2 + R2)} \cdot e1 +$$

$$\frac{re2 + R2}{re1 + R1 + re2 + R2} \cdot \frac{re3 + R3 + re4 + R4}{re3 + R3} \cdot es$$

wherein es is a signal voltage outputted from an output terminal of the preamplifier 4 and en (=e1=e2) is a noise voltage. Thus, when e1=e2 and (re2+R2)(re3+R3)=(re1+R1)(re4+R4).

$$Vo = \frac{re2 + R2}{re1 + R1 + re2 + R2} \cdot \frac{re3 + R3 + re4 + R4}{re3 + R3} \cdot es$$

Consequently, noise component is canceled.

Figure 4:
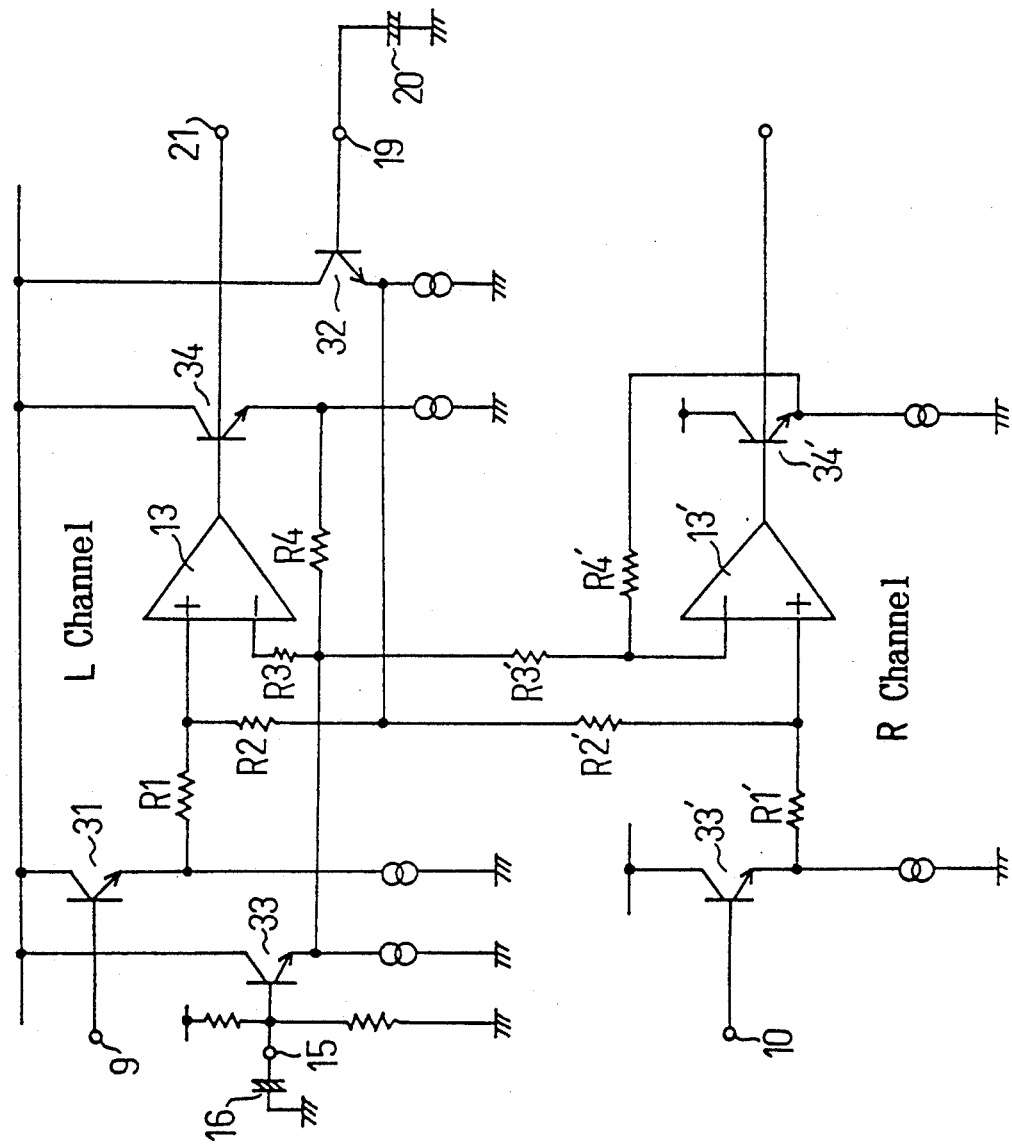
FIG. 4 is a diagram of a circuit where the present invention is employed for both an L and R channels of a car audio apparatus.

FIG. 4 shows an embodiment where the isolation amplifier circuit of FIG. 2 is employed for both of the stereo L and R channels of a car audio apparatus. In this embodiment, the ground terminals 15 and 19, and the third and fourth emitter followers 32 and 33 are used for both of the L and R channels. In FIG. 4, the numeral 13' is an operation amplifier for the R channel, the numeral 33' is a fifth emitter follower to which an R-channel audio signal from an input terminal 10 is inputted, and the numeral 34' is a sixth emitter follower in a feedback path of the operation amplifier 13'.

Figure 5:
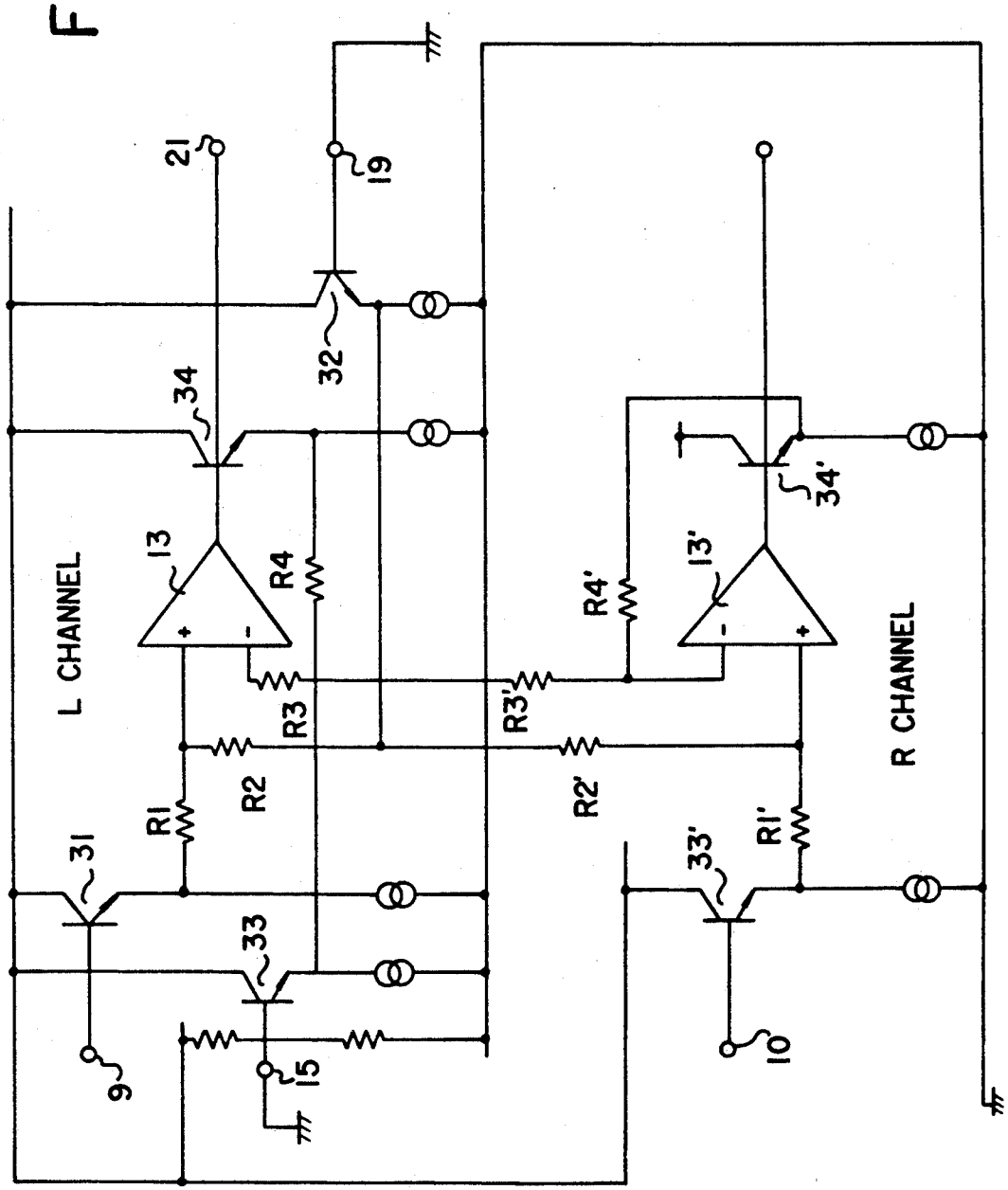
FIG. 5 is a disgram of a circuit which is a different embodiment of the circiut of FIG. 4.

Although the capacitors 16 and 20 are connected to the ground terminals 15 and 19 in the above-described embodiments of FIGS. 2, 3, and 4, it is not always necessary to connect capacitors to the ground terminals 15 and 19 in implementing the present invention. For example, in FIG. 2, the ground terminal 15 may be connected through a line pattern. FIG. 5 illustrates an embodiment of the invention where ground terminals 15 and 19 are connected to ground through a line pattern. In that case, if a distance from the ground terminal 15 to a ground point is long, the line pattern has an adequate resistance, so that impedance becomes high. Thus, an implementation of the present invention is also effective in this case.

As described above, since the first and second ground impedances are equivalently converted into low impedance by the third and fourth emitter followers even if impedance thereof is high, impedance on the output side of the fourth emitter follower is not affected. Thus, a condition for canceling noise which intrudes into the first and second input terminals is never broken by the first and second ground impedances. Since the first and second impedances may be large, when capacitors are used as the first and second impedances, the capacity values of the capacitors can be small.

Furthermore, since all the dynamic resistances of the first to fourth emitter followers are identical, it becomes possible to substantially cancel the dynamic resistances, so that no distortion based on dynamic resistance is caused in an output voltage.

Moreover, when the isolation amplifier circuit is employed for a noise cancel circuit of a car audio apparatus, high-quality sound is obtained which is not affected by noise from an engine or similar noise source, and where there is no distortion.

Further, since the emitter followers are of simple structure, the entire circuit can be designed to be of simple structure.

Obviously, many modifications and variations of the present invention are possible in light of the above teachings. It is therefore to be understood that within the scope of the appended claims, the invention may be practiced other than as specifically described.

What is claimed is:

1. An isolation amplifier circuit comprising:
   an operational amplifier provided with first and second input terminals, an output terminal, and a feedback resistor for connecting said output terminal and second input terminal;
   a first emitter follower, for inputting a signal, connected to said first input terminal, said first emitter follower having a first dynamic resistance;
   a second emitter follower connected between said output terminal and said feedback resistor, said second emitter follower having a second dynamic resistance;
   a third emitter follower connected between said second input terminal and a first ground impedance, said third emitter follower having a third dynamic resistance;
   a fourth emitter follower connected between said first input terminal and a second ground impedance, said fourth emitter follower having a fourth dynamic resistance; and
   means for making said dynamic resistances of each of said first, second, third, and fourth emitter followers equal, thereby eliminating distortion caused by unequal dynamic resistances.

2. An isolation amplifier circuit according to claim 1, wherein said first, second, third, and fourth emitter followers are substantially identical with one another.

3. An isolation amplifier circuit according to claim 1, wherein
   a first resistor (R1) is connected between said first input terminal and said first emitter follower, a second resistor (R2) is connected between said first input terminal and said fourth emitter follower, a third resistor (R3) is connected between said second input terminal and said third emitter follower, and wherein said first resistor, said second resistor, said third resistor, and said feedback resistor have equal resistance values.

4. An isolation amplifier circuit according to claim 1, wherein said first and second ground impedances are capacitors of small capacity.

5. An isolation amplifier circuit according to claim 1, wherein said first and second impedances are ground line patterns.

6. An isolation amplifier circuit for a car audio apparatus comprising:
   an operational amplifier, for a left channel of a stereo sound system, provided with first and second input terminals, a first output terminal, and a first feedback resistor for connecting said first output terminal and a second input terminal;
   a first emitter follower, for inputting a left channel audio signal, connected to said first input terminal;
   a second emitter follower connected between said first output terminal and said first feedback resistor;
   a third emitter follower connected between said second input terminal and a first ground impedance;
   a fourth emitter follower connected between said first input terminal and a second ground impedance;
   an operational amplifier, for a right channel of a car stereo sound system, provided with third and fourth input terminals, a second output terminal, and a second feedback resistor for connecting said second output terminal and said fourth input terminal;
   a fifth emitter follower, for inputting a right channel audio signal, connected to said third input terminal;
   a sixth emitter follower connected between said second output terminal and said second feedback resistor;
   means for connecting said fourth input terminal to said third emitter follower in order to connect said fourth input terminal to said first ground impedance; and
   means for connecting said third input terminal to said fourth emitter follower in order to connect said third input terminal to said second ground impedance.

* * * * *